United States Patent
Cameron et al.

(10) Patent No.: US 7,704,668 B1
(45) Date of Patent: Apr. 27, 2010

(54) PHOTORESIST COMPOSITIONS AND METHODS AND ARTICLES OF MANUFACTURE COMPRISING SAME

(75) Inventors: James F. Cameron, Boston, MA (US); James Michael Mori, Boston, MA (US); George W. Orsula, Harvard, MA (US); Guangyu Xu, Northboro, MA (US); Yoshihiro Yamamoto, Niigata (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1395 days.

(21) Appl. No.: 09/129,113

(22) Filed: Aug. 4, 1998

(51) Int. Cl.
*G03F 7/009* (2006.01)
*G03F 7/004* (2006.01)

(52) U.S. Cl. .................. 430/270.1; 430/913; 430/914

(58) Field of Classification Search .............. 430/270.1, 430/302, 311, 319, 320
See application file for complete search history.

(56) References Cited

U.S. PATENT DOCUMENTS

| | | | | |
|---|---|---|---|---|
| 4,946,759 A | * | 8/1990 | Doessel et al. ........... 430/270.1 |
| 5,296,332 A | * | 3/1994 | Sachdev et al. ............. 430/270 |
| 5,322,765 A | * | 6/1994 | Clecak et al. ............... 430/326 |
| 5,397,685 A | * | 3/1995 | Daniels et al. .............. 430/325 |
| 5,498,506 A | * | 3/1996 | Wengenroth et al. ... 430/270.14 |
| 5,693,452 A | * | 12/1997 | Aoai et al. ............... 430/270.1 |
| 5,731,364 A | | 3/1998 | Sinta et al. .................... 522/31 |
| 5,847,218 A | * | 12/1998 | Ohsawa et al. .............. 564/430 |
| 5,879,856 A | | 3/1999 | Thackeray et al. ....... 430/270.1 |

\* cited by examiner

*Primary Examiner*—Amanda C. Walke
(74) *Attorney, Agent, or Firm*—Peter F. Corless; Darryl P. Frickey; Edwards Angell Palmer & Dodge LLP

(57) ABSTRACT

The invention provides positive-acting chemically-amplified photoresist compositions that can provide excellent lithographic performance as well as significantly enhanced storage stability. In one aspect, photoresist compositions are provided that comprise a solvent that is free of hydroxy groups (i.e. non-hydroxylic solvent), a resin binder and a photoactive compound that exhibits enhanced and long-term solubility in the solvent. In a further aspect, resists are provided that are formulated in a hydroxyl-containing solvent such as ethyl lactate and that contains a sulfonium salt photoactive compound that includes a sulfonate counter anion that can provide enhanced storage stability for the resist.

8 Claims, No Drawings

PHOTORESIST COMPOSITIONS AND METHODS AND ARTICLES OF MANUFACTURE COMPRISING SAME

BACKGROUND OF THE INVENTION

1. Field of the Invention

This invention relates to new photoresist compositions that can exhibit significantly improved shelf life and lithographic performance.

2. Background Art

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define a desired image to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

More recently, certain "chemically amplified" photoresist compositions have been reported. Such photoresists may be negative-acting or positive-acting and rely on multiple crosslinking events (in the case of a negative-acting resist) or deprotection reactions (in the case of a positive-acting resist) per unit of photogenerated acid. In other words, the photogenerated acid acts catalytically. In the case of positive chemically amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,851; 4,883,740; 4,810,613; and 4,491,628, and Canadian Patent Application 2,001,384. Upon selective cleavage of the blocking group through exposure of a coating layer of such a resist, a polar functional group is provided, e.g., carboxyl, phenol or imide, which results in different solubility characteristics in exposed and unexposed areas of the resist coating layer.

With the desire to produce high-density semiconductor devices, there is a movement in the industry to shorten the wavelength of exposure sources and use deep U.V. radiation. Such photoresists offer the potential of forming images of smaller features than may be possible at longer wavelength exposure. As is recognized by those in the art, "deep UV radiation" refers to exposure radiation having a wavelength in the range of 350 nm or less, more typically in the range of 300 nm or less such as radiation provided by a KrF excimer laser light (248 nm) or an ArF excimer laser light (193 nm).

An important property of a photoresist is image resolution. A developed photoresist image of fine line definition, including lines of sub-micron and sub-half micron dimensions and having vertical or essentially vertical sidewalls is highly desirable to permit accurate transfer of circuit patterns to an underlying substrate. However, many current photoresists are not capable of providing highly resolved fine line images.

Another important property of a photoresist is photospeed, which can be defined as the exposure time coupled with the exposure energy required to activate the photoactive component, e.g. to generate a sufficient amount of photoacid to provide the desired solubility differential between exposed and unexposed areas of a photoresist coating layer.

It can be critical that a resist's photospeed is within an acceptable and consistent range or value to permit desired processing of the resist. For instance, sufficiently high photospeed is important in many processes, e.g. where a number of exposures are needed such as in generating multiple patterns by a step and repeat process, or where activating radiation of reduced intensity is employed. Sufficiently high photospeed also permits reduction in the concentration of the radiation sensitive component in the photoresist. On the other hand, a resist that is "too fast", i.e. has too high photospeed, also can be undesirable. For example, an extremely high photospeed may compromise resolution of the patterned resist image, or exposure equipment may not be well suited to image such a fast resist.

Additionally, a consistent resist photospeed can be critical, e.g. so that a device manufacturer can use the same imaging conditions and obtain consistent results despite lot-to-lot differences of a resist product (such as precise amount and/or nature of the photoacid generator, polymer, etc.) that may frequently occur, particularly in large scale resist manufacturing processes. However, many current resists do not exhibit such consistent photospeed, and consequently a device manufacturer may either realize inconsistent results as different lots of a resist formulation are used, or the device manufacturer may be forced to carefully test the photospeed of each new lot of resist and then adjust the parameters of the exposure equipment to provide for consistent processing. Clearly, either alternative is undesirable.

Photospeed variations during storage also are indicative of resist degradation. For example, decreased photospeed of a resist upon storage can indicate degradation of the photoactive compound or other resist components. Storage stability is typically of high importance for a photoresist. Generally, after photoresist manufacture, a resist is stored for several months or more prior to use by a device manufacture. Any resist degradation during storage typically will only compromise lithographic properties.

It thus would be desirable to have new photoresist compositions that could provide highly resolved fine line images. It would be further desirable to have such new photoresist compositions exhibit consistent photospeed. It would be particularly desirable to have such new photoresists that show good storage stability, e.g. as indicated by consistent photospeed over time.

SUMMARY OF THE INVENTION

We have now discovered new positive-acting chemically-amplified photoresist compositions that can provide excellent lithographic performance as well as significantly enhanced storage stability.

More particularly, the invention provides photoresist compositions that comprise a solvent that is free of hydroxy groups (i.e. non-hydroxylic solvent), a resin binder and a sulfonium photoacid generator compound (PAG) that exhibits enhanced solubility in the solvent. These resists also can exhibit excellent storage stability, e.g. as exhibited by consistent photospeed over extended storage times.

Non-hydroxylic photoresist solvents, such as propylene glycol methyl ether acetate (PMA) or other glycol alkyl ether acetates, generally exhibit decreased solubility characteristics, particularly with respect to onium salt PAGs, relative to hydroxylic photoresist solvents such as ethyl lactate. However, the resists of the invention exhibit exceptionally good solubility characteristics and storage stability when formulated in PMA and other non-hydroxylic solvents.

Preferred photoacid generator compounds of the invention for use with a non-hydroxylic solvent include sulfonium salts that contain lipophilic moieties. Such moieties have been found to impart enhanced solubility characteristics to the photoactive compound, and ultimately enable significantly increased storage stability of a resist containing the PAG. See the results of the examples which follow. Preferred lipophilic PAGs of the invention have one or more alkyl or heteroalkyl substituents, with each substituent having 2 or more carbon atoms, more preferably 3 or more carbon atoms, still more preferably about 4, 5, 6, 7, 8, 9, 10, 11 or 12 or more carbon atoms. Alkoxy is a preferred heteroalkyl, although other groups can be employed, such as alkylsulfide, alkylsulfinyl, alkylsulfonyl, aminoalkyl, etc.

Additional preferred photoacid generator compounds of the invention for use with a non-hydroxylic solvent are triarylsulfonium salts that have optionally substituted arylsulfonate counter anions, optionally substituted alicyclic sulfonate counter anions, or optionally substituted acyclic (i.e. noncyclic) sulfonate counter anions.

Preferred arylsulfonate counter anions in this aspect of the invention include halo- or haloalkyl-substituted arylsulfonate anions, or arylsulfonate anions substituted with other electron-withdrawing groups such as nitro, cyano and the like. For example, preferred counter anions include fluoro($C_{1-16}$) benzenesulfonate such as 3,5,-bis(trifluoromethyl)benzenesulfonate, 4-trifluoromethylbenzenesulfonate, perfluorooctanesulfonate and other perfluoroalkylarylsulfonate and perfluoroalkylsulfonate such as perfluorohexanesulfonic acid, perfluoro(4-ethylcyclohexane)sulfonic acid, perfluorobutanesulfonic acid and the like; halobenzenesulfonate, particularly fluorobenzenesulfonate including pentafluorobenzenesulfonate and the like; nitrobenzenesulfonate such as 2,4-dinitrobenzenesulfonate and the like. Preferred alicyclic sulfonate counter anions include optionally substituted single ring groups such as cyclohexyl sulfonate, cyclohepylsulfonate, and more preferably optionally substituted multiple ring groups (e.g. about 2, 3 or 4 bridged or otherwise linked alicyclic groups) such as camphor sulfonate, adamantyl sulfonate and the like. Substituents of substituted alicyclic groups include keto (e.g. as in the case of camphor sulfonate where the ring carbon contains a keto substituent), alkyl having 1 to about 16 carbons, alkenyl or alkynyl having 2 to about 16 carbons (e.g. as in the case of camphene) and the like. Phenyl is a generally preferred aryl group of the arylsulfonate anions, although other aryl groups such as naphthyl and the like also can be suitable. Phenyl also is a preferred aryl group of the triarylsulfonium compound, i.e. triphenylsulfonium PAGs are preferred, especially when combined with an optionally substituted sulfonate counter anion as described above.

The resin binder component of resists of the invention can be a wide variety of materials. Preferred are chemically amplified positive-acting resists that comprise a resin that contains photoacid labile groups, e.g. resins that contain photoacid-labile acetal or ketal groups such as disclosed in European Patent Application 0829766A2 of the Shipley Company, or other resins such as the copolymers described in European Patent Application EP0783136A2 of the Shipley Company. While acetals and ketals are generally preferred photoacid labile groups for use with a non-hydroxylic solvent, other acid labile groups also will be suitable, such as acid sensitive esters, carbonates, ethers, imides, etc. The photoacid labile groups will more typically be pendant from a polymer backbone, although resins that have acid labile groups that are integral to the polymer backbone also may be employed.

In this aspect of the invention, preferably the solvent component will substantially, essentially or completely be formed from one or more non-hydroxylic solvents, with only a minor portion of a hydroxy-solvent such as ethyl lactate. More particularly, as referred to herein, a solvent component (i.e. all non-solid additives of a resist formulation) will substantially comprise one or more non-hydroxylic solvents where the non-hydroxylic solvent content is present in an amount of at least about 80 wt % or 85 wt %, based on total weight of the solvent component. A solvent component will essentially comprise one or more non-hydroxylic solvents where the non-hydroxylic solvent content is present in an amount of at least about 90 wt %, 92 wt %, 95 wt % or 97 wt %, based on total weight of the solvent component. A solvent component will consist of only one or more non-hydroxylic solvents where the non-hydroxylic solvent(s) are present in least about 98 wt % or 99 wt %, based on total weight of the solvent component.

In a further aspect, the invention provides methods for enhancing storage stability of positive chemically-amplified photoresist compositions that comprise a hydroxy-containing solvent (e.g. ethyl lactate), a photoacid-deblocking component which is typically a resin binder and one or more arylsulfonium compounds, particularly one or more arylsulfonium PAGs, e.g. one or more of the same or different triarylsulfonium PAGs, such as those discussed above, that are preferably complexed with a sulfonate counter anion, such as the aryl, alicyclic or acyclic sulfonate counter anions as described herein.

We have surprisingly found that use of such arylsulfonium compounds can provide significantly enhanced storage stability relative to an otherwise comparable resist that contains a distinct PAG such as an diaryliodonium PAG. See, for instance, the results of Examples 3 and 3a which follow.

The invention further provides methods for forming photoresist relief images and novel articles of manufacture comprising substrates such as a microelectronic wafer or a flat panel display substrate that have been coated with a photoresist composition of the invention. Other aspects of the invention are disclosed infra.

DETAILED DESCRIPTION OF THE INVENTION

As discussed above, preferred photoresists of the invention comprise a non-hydroxylic solvent such as PMA, a resin binder and a photoacid generator compound (PAG) that exhibits enhanced solubility in the solvent.

In one aspect, the PAG contains one or more lipophilic moieties, particularly one or more optionally substituted alkyl or heteroalkyl moieties having 2 or more carbons, preferably one or more optionally substituted $C_{2-20}$ alkyl or $C_{2-20}$ heteroalkyl moieties, more typically one or more optionally substituted $C_{2-16}$ alkyl or $C_{2-16}$ heteroalkyl moieties. A generally preferred heteroalkyl is alkoxy having one or more oxygen linkages, typically 1-3 oxygen linkages.

Preferably the PAG that is substituted with one or more lipophilic moieties is a sulfonium compound, particularly an arylsulfonium compound such as a phenylsulfonium compound. For example, suitable PAGs include compounds of any of the following Formulae I through V:

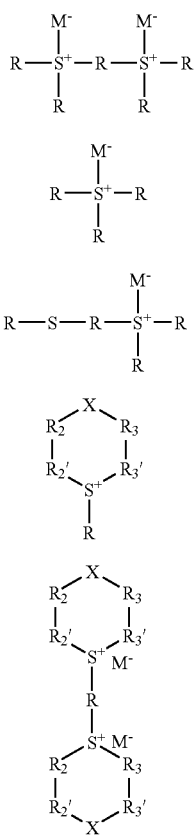

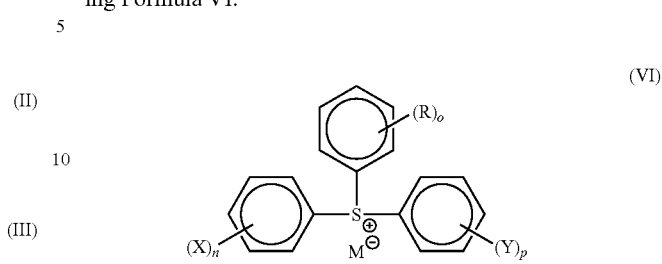

wherein in each of the above formulae (I) through (V), each R is independently an optionally substituted aryl group, with at least one or the R groups of a compound of any of the above formulae being aryl substituted with one or more optionally substituted alkyl or heteroalkyl having 2 or more carbon atoms, preferably 3 or more carbon atoms;

in Formulae IV and V, $R^2$ and $R^{2'}$ are members of a first fused aryl ring; each $R^3$ and $R^{3'}$ are members of a second fused aryl ring, and where such first and second fused aryl rings may optionally substituted with one or more R groups as defined above;

each X is independently a hetero atom (N, O or S, preferably O or S), a $C_{1-3}$ alkylene, or a hetero-substituted $C_{1-3}$ alkylene;

and each M in the above formulae is the same or different and is a counter anion.

In those Formulae I through V, R is preferably a phenyl group, although other aryl groups also will be suitable such as naphthyl, acenaphthyl, etc. Preferred PAGs of the Formulae I through V above include those that have two or more R groups that contain longer chain alkyl or heteroalkyl substituents. Preferred R groups include those having about 3 or 4 or more carbon atoms, even more preferably about 5 or 6 or more carbon atoms, still more preferably about 7 or 8 or more carbon atoms. Alkyl and alkoxy are generally preferred R groups.

Additional preferred PAGs for use in resists that have non-hydroxylic solvents are triarylsulfonium compounds that have long chain substitution on at least one aryl group, and are substituted with distinct groups on one or both of the other aryl groups of the compound; i.e., the compounds are asymmetrically substituted. For instance, suitable asymmetric triphenyl sulfonium PAGs for use in accordance with the invention include compounds of the following of the following Formula VI:

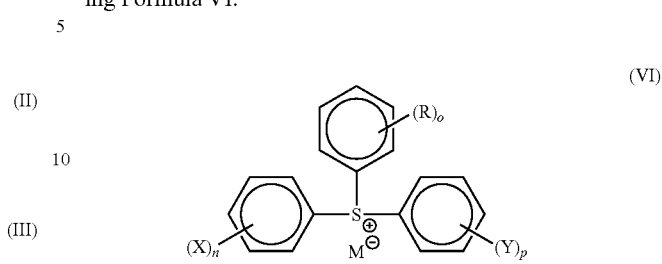

wherein each R is independently alkyl or heteroalkyl having 2 or more carbon atoms, preferably having 3 or 4 or more carbon atoms, wherein each X and Y is independently hydrogen or a non-hydrogen substituent such as halo; nitro; cyano; sulfonyl; optionally substituted alkyl preferably having from 1 to about 20 carbon atoms; optionally substituted alkoxy preferably having from 1 to about 20 carbon atoms; optionally substituted aminoalkyl preferably having from 1 to about 20 carbon atoms; optionally substituted alkylthio preferably having from 1 to about 20 carbon atoms; optionally substituted alkylsulfinyl preferably having from 1 to about 20 carbon atoms; optionally substituted alkylsulfonyl preferably having from 1 to about 20 carbon atoms; optionally substituted aryloxy such as phenoxy; optionally substituted aralkyl such as benzyl; optionally substituted alkanoyl preferably having from 1 to about 20 carbons atoms with acetyl being a preferred group; optionally substituted carbocyclic aryl such as phenyl, naphthyl, biphenyl, and the like; optionally substituted heteroaromatic or heteroalicyclic having 1 to 3 rings, 3 to 8 ring members in each ring and from 1 to 3 hetero atoms; and the like;

with at least one of X and Y being other than hydrogen (a non-hydrogen substituent) and different from R;

M is a counter anion; and n, o or p are each independently an integer of from 1 to 5, preferably 1 to 4, more preferably 1, 2 or 3.

Preferred compounds of the above Formulae VI include compounds that have one or more two non-hydrogen substituents on each phenyl ring, particularly compounds of the following Formula VIa:

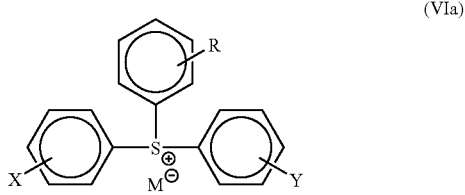

wherein R and M are the same as defined above for Formula VI; X and Y are the same or different non-hydrogen substituents as defined above for Formula VI, and X and Y are each different than R. Para substitution of the phenyl rings by the R, X and Y substituents is generally preferred, although ortho or meta substitution also will be suitable.

Specifically preferred PAGs of Formula VIa include bis-($C_{1-20}$alkylphenyl)-($C_{1-20}$alkoxyphenyl)sulfonium salts such as bis-(methylphenyl)-($C_{1-12}$alkoxyphenyl)sulfonium salt, particularly bis-(methylphenyl)-($C_{1-12}$alkoxyphenyl)sulfonium salt. Also preferred are PAGs of Formula VIa that has phenyl groups that are each substituted by phenyl, preferably with the R group being branched. For example, such preferred tri-(alkylphenyl)sulfonium salts include bis-(n-$C_{1-12}$alkylphenyl)-(branched-$C_{1-12}$alkylphenyl)sulfonium salt, such as bis-(methylphenyl)-(t-butylphenyl)sulfonium salt, preferably bis-(4-methylphenyl)-(4-t-butylphenyl)sulfonium salt.

It has been found that use of such PAGs with one or more longer-chain substituents (such as a PAG of any of Formulae I through VI and VIa above) can significantly improve solubility in non-hydroxylic solvents such as PMA and the like, which in turn can impart substantially enhanced shelf-life to the photoresist. In particular, photospeeds of resists of the invention remain substantially constant over storage periods, whereas photospeeds have varied over storage time with comparable resists that do not contain the PAG extended-chain group, indicating degradation of the comparison resists over storage time. See, for instance, the results of the examples which follow.

For compounds of the above formulae, a wide variety of M groups will be suitable, including sulfonates such as alkyl sulfonates, particularly $C_{1-12}$ alkylsulfonates such as mesylate and the like, and the counter anions discussed below. Preferred M groups include the arylsulfonate and alicyclic counter anions discussed below that can further enhance solubility in a non-hydroxylic solvent.

Various substituent groups of PAGs and resins described herein, including R, $R^1$, X and Y moieties of the formulae above, may be optionally substituted. Such substituted groups are suitably at one or more available positions by, e.g., halogen such as F, Cl Br and/or I; alkyl including $C_{1-16}$ alkyl with $C_{1-8}$ alkyl being preferred; alkoxy including $C_{1-16}$alkoxy having one or more oxygen linkages with $C_{1-8}$ alkoxy being preferred; alkenyl including $C_{2-12}$ alkenyl with $C_{2-8}$alkenyl being preferred; alkynyl including $C_{2-12}$ alkynyl with $C_{2-8}$alkynyl being preferred; aminoalkyl including $C_{1-8}$ aminoalkyl with one or more amino linkages; thio including alkylthio preferably having 1 to about 8 carbon atoms and one or more thio linkages as well as arylthio such as phenylthio; aryl such as phenyl or naphthyl and substituted aryl such as halo, alkoxy, alkenyl, alkynyl and/or alkyl substituted aryl, preferably having the number of carbon atoms mentioned above for corresponding groups.

As discussed above, additional preferred photoactive compounds of the invention for use with a non-hydroxylic solvent are triarylsulfonium salts that have arylsulfonate counter anions, particularly halo- or haloalkyl-substituted arylsulfonate anions, or arylsulfonate anions substituted with other electron-withdrawing groups such as nitro, cyano and the like.

As further discussed above, additional preferred photoactive compounds of the invention for use with a non-hydroxylic solvent are triarylsulfonium salts that have alicyclic sulfonate counter anions, particularly multiple-ring groups such as adamantyl and the like.

More specifically, preferred counter anions include fluoroalkylarylsulfonates such as fluoro($C_{1-16}$)benzenesulfonate, particularly perfluoroalkylarylsulfonates such as 3,5,-bis(trifluoromethyl)benzenesulfonate, 4-trifluoromethylbenzenesulfonate, as well as perfluoroalkylsulfonates such as perfluorooctanesulfonate, perfluorohexanesulfonic acid, perfluoro (4-ethylcyclohexane)sulfonic acid, perfluorobutanesulfonic acid and the like; halobenzenesulfonate, particularly fluorobenzenesulfonate including pentafluorobenzenesulfonate and the like; nitrobenzenesulfonate such as 2,4-dinitrobenzenesulfonate and the like. Phenyl is a generally preferred aryl group of the arylsulfonate anions, although other aryl groups such as naphthyl and the like also can be suitable. Preferred alicyclic sulfonate counter anions include single ring groups such as cyclohexyl sulfonate, cyclohepylsulfonate, and more preferably multiple ring groups (e.g. about 2, 3 or 4 bridged or otherwise linked groups) such as camphor sulfonate, adamantyl sulfonate and the like. Preferred substituents of substituted alicyclic groups include keto, halogen particularly fluoro, $C_{1-16}$alkyl, $C_{2-16}$ alkenyl or alkynyl or any of the substituents mentioned above for the arylsulfonate anions. Preferred acyclic sulfonate counter anions include alkyl sulfonate compounds, such as $C_{1-16}$ alkyl sulfonate, more preferably $C_{3-12}$ alkyl sulfonate, that may be optionally substituted with groups such as those mentioned above for alicyclic groups. Preferred substituents for acyclic sulfonate counter anions are one or more halogen, particularly fluoro, especially a perfluoroalkyl sulfonate.

PAGs of the above formulae may be preferred by known procedures and as described herein, including in Examples 4 and 5 below. See also U.S. Pat. No. 5,731,364; S. R. Akhtar et al., *Chem. Mater.*, (1990) 2:732; S. R. Akhtar et al., *J. Org. Chem.*, (1990) 55:4222; and Miller et al., *J. Org. Chem.*, (1988) 53:5571, for synthetic methods.

The invention further provides methods for enhancing storage stability of photoresist compositions that comprise hydroxy-containing solvent (e.g. ethyl lactate), a resin binder and one or more arylsulfonium compounds. Arylsulfonium compounds discussed above are suitable for this aspect of the invention, particularly PAGs of any one of Formula I through VI and VIa above.

As discussed above, photoresists of the invention also contain a deblocking component, which suitably will be a resin binder of a resist. The deblocking component may contain any of a variety of acid labile groups, such as acid sensitive esters, acetals, ketals and the like, which suitably may be pendant from a polymer backbone. Acid labile groups that are integral to the polymer backbone also may be employed. Preferred deblocking resin binders have also been disclosed in European Patent Published Application EP0813113A1 and European Patent Application 97115532 (corresponding to U.S. application Ser. No. 08/706,138), and in U.S. Pat. No. 5,258,257 to Sinta et al. Suitable deblocking resins and use of same in chemically amplified photoresists also have been described in U.S. Pat. Nos. 4,968,581; 4,883,740; 4,810,613; 4,491,628 and 5,492,793.

Preferred deblocking resins for use in the resists of the invention include polymers that contain both phenolic and non-phenolic units. For example, one preferred group of such polymers has acid labile groups substantially, essentially or completely only on non-phenolic units of the polymer. One preferred polymer binder has repeating units x and y of the following formula:

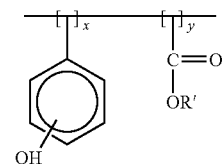

wherein the hydroxyl group be present at either the ortho, meta or para positions throughout the polymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The depicted phenolic units of the polymer also may be optionally substituted by such groups. The units x and y may be regularly alternating in the polymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, of the acrylate units serves as the acid labile groups of the resin and will undergo photoacid induced cleavage upon exposure of a coating layer of a photoresist containing the resin. Preferably the copolymer will have a Mw of from about 3,000 to about 50,000, more preferably about 10,000 to about 30,000 with a molecular weight distribution of about 3 or less, more preferably a molecular weight distribution of about 2 or less. Such copolymers also may be prepared by such free radical polymerization or other known procedures and suitably will have a Mw of from about 3,000 to about 50,000, and a molecular weight distribution of about 3 or less, more preferably a molecular weight distribution of about 2 or less.

Additional preferred deblocking resins have acid labile groups on both phenolic and non-phenolic units of the polymer. One preferred polymer binder has repeating units a, b and c of the following formula:

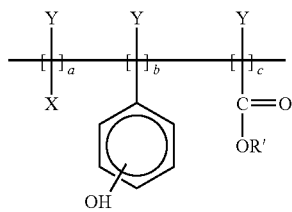

wherein R' group is a photoacid labile group as defined above for the other preferred polymer; X is another repeat unit which may or may not contain a photoacid labile group; and each Y is independently hydrogen or $C_{1-6}$ alkyl, preferably hydrogen or methyl. The values a, b and c designate the molar amount of the polymer units. Those polymer units may be regularly alternating in the polymer, or may be randomly interspersed through the polymer. Suitable X groups may be aliphatic or aromatic groups such as phenyl, cyclohexyl, adamantyl, isobornyl, optionally containing an acid labile group. Such polymers may be formed in the same manner as described for the polymer above, and wherein the formed copolymer is reacted to provide the phenolic acid labile groups.

Additional preferred deblocking resins include at least three distinct repeating units of 1) units that contain acid-labile groups; 2) units that are free of reactive groups as well as hydroxy groups; and 3) aromatic or other units that contribute to aqueous developability of a photoresist containing the polymer as a resin binder. Particularly preferred deblocking polymers of this type correspond to the following Formula I:

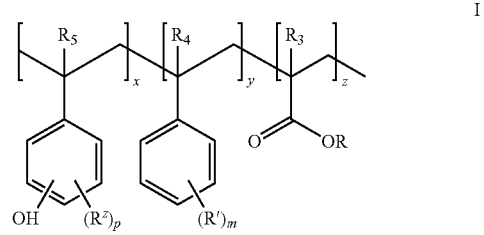

wherein R of units 1) is substituted or unsubstituted alkyl preferably having 1 to about 10 carbon atoms, more typically 1 to about 6 carbons. Branched alkyl such as tert-butyl are generally preferred R groups. Also, the polymer may comprise a mixture of different R groups, e.g., by using a variety of acrylate monomers during the polymer synthesis.

$R^1$ groups of units 2) of the above Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted alkynyl preferably having 2 to about 8 carbons, substituted or unsubstituted alkylthio preferably having 1 to about 8 carbons, cyano, nitro, etc.; and m is an integer of from 0 (where the phenyl ring is fully hydrogen-substituted) to 5, and preferably is 0, 1 or 2. Also, two R' groups on adjacent carbons may be taken together to form (with ring carbons to which they are attached) one, two or more fused aromatic or alicyclic rings having from 4 to about 8 ring members per ring. For example, two R' groups can be taken together to form (together with the depicted phenyl) a naphthyl or acenaphthyl ring. As with units 1), the polymer may comprise a mixture of different units 2) with differing R' groups or no R' groups (i.e. m=0) by using a variety of substituted or unsubstituted vinylphenyl monomers during the polymer synthesis.

$R^2$ groups of units 3) of the above Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted sulfonyl preferably having 1 to about to about 8 carbon atoms such as mesyl ($CH_3SO_2O$—), substituted or unsubstituted alkyl esters such as those represented by RCOO— where R is preferably an alkyl group preferably having 1 to about 10 carbon atoms, substituted or unsubstituted alkynyl preferably having 2 to about 8 carbons, substituted or unsubstituted alkylthio preferably having 1 to about 8 carbons, cyano, nitro, etc.; and p is an integer of from 0 (where the phenyl ring has a single hydroxy substituent) to 4, and preferably is 0, 1 or 2. Also, two $R^2$ groups on adjacent carbons may be taken together to form (with ring carbons to which they are attached) one, two or more fused aromatic or alicyclic rings having from 4 to about 8 ring members per ring. For example, two $R^2$ groups can be taken together to form (together with the phenol depicted in Formula I) a naphthyl or acenaphthyl ring. As with units 1), the polymer may comprise a mixture of different units 3) with differing $R^2$ groups or no $R^2$ groups (i.e. p=0) by using a variety of substituted or unsubstituted vinylphenyl monomers during the polymer synthesis. As shown in Formula I above, the hydroxyl group of units 3) may be either at the ortho, meta or para positions throughout the copolymer. Para or meta substitution is generally preferred.

Each $R^3$, $R^4$ and $R^5$ substituent independently may be hydrogen or substituted or unsubstituted alkyl preferably having 1 to about 8 carbon atoms, more typically 1 to about 6 carbons, or more preferably 1 to about 3 carbons.

The above-mentioned substituted groups (i.e. substituted groups R and $R^1$ through $R^5$ of Formula I above) may be substituted at one or more available positions by one or more suitable groups such as halogen (particularly F, Cl or Br); $C_{1-8}$ alkyl; $C_{1-8}$ alkoxy; $C_{2-8}$ alkenyl; $C_{2-8}$ alkynyl; aryl such as phenyl; alkanoyl such as a $C_{1-6}$ alkanoyl of acyl and the like; etc. Typically a substituted moiety is substituted at one, two or three available positions.

In the above Formula I, x, y and z are the mole fractions or percents of units 3), 2) and 1) respectively in the copolymer. These mole fractions may suitably vary over rather wide values, e.g., x may be suitably from about 10 to 90 percent, more preferably about 20 to 90 percent; y may be suitably from about 1 to 75 percent, more preferably about 2 to 60 percent; and z may be 1 to 75 percent, more preferably about 2 to 60 percent.

Preferred copolymers of the above Formula I include those where the only polymer units correspond to the general structures of units 1), 2) and 3) above and the sum of the mole percents x, y and z equals one hundred. However, preferred polymers also may comprise additional units wherein the sum of x, y and z would be less than one hundred, although preferably those units 1), 2) and 3) would still constitute a major portion of the copolymer, e.g. where the sum of x, y and z would be at least about 50 percent (i.e. at least 50 molar percent of the polymer consists of units 1), 2) and 3)), more preferably the sum of x, y and z is at least 70 percent, and still more preferably the sum of x, y and z is at least 80 or 90 percent. See European Published Patent Application EP 0813113A1 for detailed disclosure of free radical synthesis of copolymers of the above Formula I.

For resists of the invention formulated in non-hydroxylic solvents such as PMA, particularly suitable resin binders include those that have acetalester and/or ketalester deblocking groups. Such resins are disclosed in EP 0829766A2 of the Shipley Company and U. Kumar. For instance, suitable resins include terpolymers formed from hydroxystryene, styrene and acid labile components such as 1-propyloxy-1-ethyl-methacrylate and the like. See the examples of EP 0829766A2, and the examples herein which follow for particularly suitable polymers. Additionally, preferred acetal or ketal polymers include units of any of the following Formula (A), (B), (C) or (D):

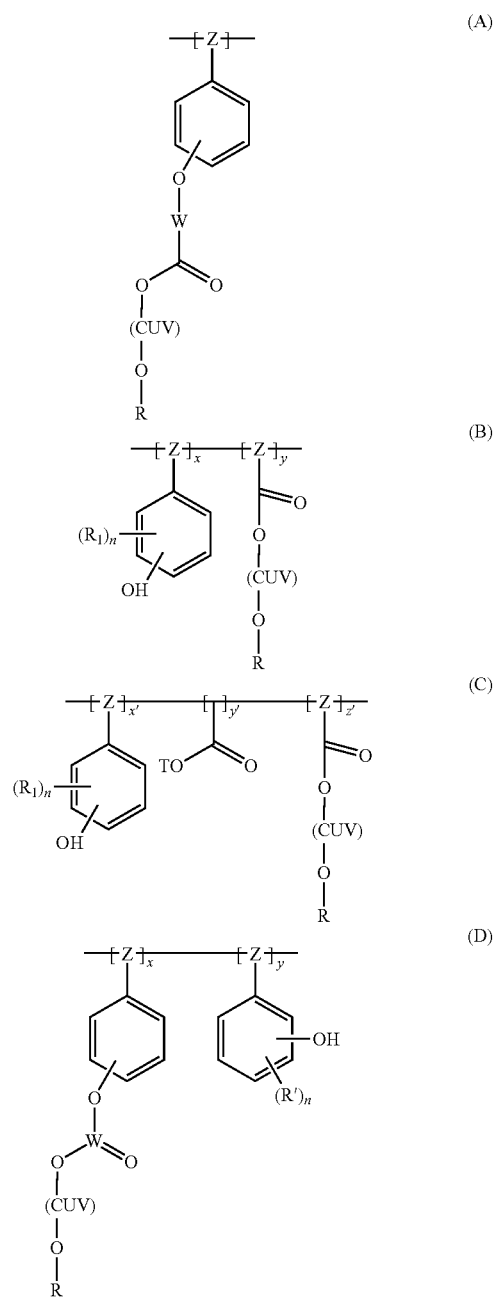

wherein the above Formula (A), W is a linker any may be e.g. a chemical bond; an optionally alkylene group preferably having 1 to about 12 carbons; optionally substituted alkenylene preferably having 3 to about 12 carbons; optionally substituted alkynylene preferably having from 3 to about 12 carbons and the like; in each of the above Formulae (A), (B), (C) and (D), each Z is an independent bridge group between polymer units e.g. optionally substituted alkylene linkage having 1-6 carbons, more typically 1-3 carbons and optionally substituted by $C_{1-2}$ alkyl;

in each of the above Formulae (A), (B), (C) and (D), U and V each independently may be hydrogen; halogen; optionally substituted alkyl, preferably having from 1 to about 20 carbons, more preferably 1 to about 8 carbons; optionally substituted alkenyl or alkynyl, preferably having from 2 to about 20 carbons, more preferably 2 to about 8 carbons; optionally substituted alkanoyl, preferably having 1 to about 12 carbons, more preferably 1 to about 8 carbons; optionally substituted carbocyclic aryl such as phenyl, preferably having from 6 to about 24 carbons; optionally substituted aralkyl such as benzyl, preferably having from 7 to 24 carbons; optionally substituted heterocyclic or heteroaromatic having 1 to 3 ring members and from 1 to about 3 atoms; and the like, preferably with at least one of U or V being other than hydrogen;

R is optionally substituted alkyl, preferably having 1 to about 20 carbons, more preferably 1 to about 15 carbons; optionally substituted alkenyl or alkynyl, preferably having 2 to about 20 carbons, more preferably 2 to about 15 carbons; optionally substituted alkanoyl, preferably having 1 to about 20 carbons, more preferably 1 to about 8 carbons; optionally substituted carbocyclic aryl such as phenyl, preferably having 6 to about 24 carbons; optionally substituted aralkyl such as benzyl, preferably having from 7 to 24 carbons; optionally substituted heterocyclic or heteroaromatic having 1 to 3 ring members and from 1 to about 3 atoms; and the like;

or R and at least one of U and V may be taken together with the depicted interposed oxygen to form a ring structure, preferably an alicyclic structure having one, two or more rings, each ring having 4 to about 10 ring members and the U or V and R groups are optionally substituted alkylene or heteroalkylene (i.e. alkylene with a N, O or S linkage). For example, R and at least one of U and V may be taken together with the depicted interposed oxygen (i.e. the oxygen between the groups CUV and R) so as to form e.g. tetrahydropyranyl or tetrahydrofuranyl i.e. acetal/ketalester groups pendant to the polymer backbone of the formulae —C(=O)—O-(2-tetrahydropyranyl) or —C(=O)—O-(2-tetrahydrofuranyl);

in Formula (B), (C) (D), each $R^1$ is independently halogen, optionally substituted alkyl preferably having 1 to about 12 carbon atoms, optionally substituted alkoxy preferably having 1 to about 12 carbon atoms, optionally substituted alkenyl preferably having 2 to about 12 carbon atoms, optionally substituted alkynyl preferably having 2 to about 12 carbon atoms, optionally substituted alkylthio preferably having 1 to about 12 carbon atoms, cyano, nitro, amino, hydroxy, etc., or two $R^1$ groups on adjacent carbons may be taken together to form (with ring carbons to which they are attached) one, two or more fused aromatic or alicyclic rings having from 4 to about 8 ring members per ring (such as to form with the depicted phenyl a optionally substituted naphthyl or acenaphthyl ring), and n is an integer of from 0 (where the phenyl ring is fully hydrogen-substituted) to 4, and preferably is 0, 1 or 2;

in Formula (C), T is preferably a high carbon moiety and may be e.g. optionally substituted alkyl having from 4 to about 20 carbons, and preferably is a cyclic group such as adamantyl, norbornyl, isobornyl and the like, or optionally substituted aryl, particularly carbocyclic aryl such as phenyl, naphthyl, acenaphthyl, anthracenyl, phenanthracenyl, etc.; optionally substituted aralkyl such as benzyl, benzhydryl, etc.; or optionally substituted heterocyclic or heteroaromatic having 1 to 3 ring members and from 1 to about 3 atoms;

x and y are the mole percents of the respective units in the polymer of Formula (B) and (D), and preferably x any y will each be in the range of from about 5 to 90 percent, and more typically x will be from about 50 to 95 mole percent;

x', y' and z' are the mole percents of the respective units in the polymer of Formula (C), and preferably x' is from about 60 to 80 percent, and y' and z' are each from about 10 to 30 mole percent.

A preferred optional additive of resists of the invention is an added base, particularly tetrabutylammonium hydroxide (TBAH), which can enhance resolution of a developed resist relief image. A TBAH acetate salt is often preferred, particularly in a PMA-based resist. The added base is suitably used in relatively small amounts, e.g. about 1 to 10 percent by weight relative to the PAC, more typically 1 to about 5 weight percent.1. Other preferred basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent as discussed above. Thus, in the first aspect of the invention, the resist is formulated in a non-hydroxylic solvents such as PMA; EEP (ethyl ethoxy propionate); or other glycol ethers such as 2-methoxyethyl ether (diglyme); ketones such as methyl ethyl ketone, 2-heptanone and cyclohexanone; with PMA being generally preferred.

As discussed above, the invention also provides methods for enhancing storage stability of positive-acting chemically amplified photoresist compositions that contain a hydroxy-containing solvent, particularly ethyl lactate or methyl lactate. Other suitable hydroxy-containing solvents include ethylene glycol monomethyl ether and propylene glycol monomethyl ether.

Typically, the solids content of a resist of the invention varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components.

The resists of the invention are used in accordance with generally known procedures. The liquid coating compositions of the invention are applied to substrate such as by spinning, dipping, roller coating or other technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating of photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 300 mJ/cm$^2$, dependent on the exposure tool and the components of the photoresist composition.

Coating layers of the resist compositions of the invention are suitably photoactivated by an exposure wavelength in the deep U.V. range i.e., 350 nm or less, more typically in the range of about 300 nm or less, typically about 150 to 300 or 350 nm. A particularly preferred exposure wavelength is about 248 nm.

Following exposure, the resist film layer is preferably baked at temperatures ranging from about 50° C. to about 160° C. to create or enhance solubility differences between exposed and unexposed regions of the resist layer.

After any such post-exposure bake, the patterned film layer is developed, preferably using an aqueous-based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For example, for the manufacture of microelectronic substrates, suitable etchants include a plasma gas etch (e.g. an oxygen plasma etch) and a hydrofluoric acid etching solution. After such processing, resist may be removed from the processed substrate using known stripping procedures.

All documents mentioned herein are incorporated herein in their entirety by reference. The following non-limiting examples are illustrative of the invention.

General Comments

In the following examples, the term "total solids" refers to all components of the resist formulation other than solvent. Resist samples were filtered to 0.2 μm immediately after preparation. Photospeed ($E_o$) was calculated as the exposure dose (mj/cm$^2$) necessary to remove the imaged resist layer upon development. In each of the resist formulations of Examples 1 and 1a below, the resin binder was the same blend of 1) poly(4-hydroxysytrene-co-4-t-butyloxycarbonyloxystyrene) and 2) partially hydrogenated poly(4-hydroxystyrene) modified with ethoxy ethyl protecting on a portion of the phenolic and/or cyclohexanol —OH groups. In each of the resist formulations of Examples 2 and 2a below, the resin binder was the same blend of 1) poly(4-hydroxysytrene-co-4-t-butylacrylate) and 2) partially hydrogenated poly(4-hydroxystyrene) modified with ethoxy ethyl protecting on a portion of the phenolic and/or cyclohexanol —OH groups. In each of the resist formulations of Examples 3 and 3a below, the resin binder was the same blend of 1) poly(4-hydroxysytrene-co-4-t-butylacrylate) and 2) partially hydrogenated poly(4-hydroxystyrene) modified with ethoxy ethyl protecting on a portion of the phenolic and/or cyclohexanol —OH groups. Each of the resists contained an additive of tetrabutylammonium hydroxide, in Examples 1, 1a, 2 and 2a, that additive was present at 0.25 wt % of the resin binder, and in Examples 3 and 3a that additive was present at 0.22 wt % of the resin binder. Each of the resists also contained an additive of a commercially available surface leveling agent (FC430 from 3M), in Examples 1, 1a, 2 and 2a, that additive was present at 0.13 weight % of the resin binder, and in Examples 3 and 3a that additive was present at 0.50 wt % of the resin binder. In Example 3, the triarylsulfonium PAG was a mixture of triarylsulfonium compounds that can be provided by the procedure of Example 1a of U.S. Pat. No. 5,731,364.

Example 1

A photoresist formulation was prepared by admixing the following components and above-mentioned additives of the specified amounts:

| Component | Amount: |
|---|---|
| 1. Resin Binder | 18.41 grams |
| 2. PAG: di-(4-tolyl)-4-octyloxyphenylsulfonium camphorsulfonate | 3.23 weight % of resin binder |
| 3. Solvent: PMA | added to provide a solution at 19 weight % solids |

Samples of the resist formulation were stored at temperatures of 4° C., 20° C. and 40° C. in dark-colored glass bottles for 0 days (control), 7 days and 14 days after resist preparation.

Each of the resist formulations was spin coated onto a silicon wafer substrate to a layer thickness of 6990 angstroms and soft-baked on a vacuum hotplate at 90° C. for 90 seconds. The dried resist layer was then exposed (GCA XLS 7800 DUV stepper 0.53NA, 0.74 sigma) with CymerKrF Laser), post-exposure baked at 110° C. for 90 seconds and developed with 0.26N aqueous tetramethylammonium hydroxide solution for 45 seconds SSP (single spray puddle development).

For the resist formulation samples (i.e., the samples stored for 0, 7 or 14 days after preparation at the above-specified temperatures), no change in photospeed was observed between samples stored at 0, 7 or 14 days at the varying temperatures, thus indicating good storage stability of the resist formulation.

Example 1a

Comparative Using Iodonium-Type PAG)

A comparative photoresist formulation was prepared by admixing the following components and above-mentioned additives of the specified amounts:

| Component | Amount: |
|---|---|
| 1. Resin Binder | 18.43 grams |
| 2. PAG: di-(4-t-butylpheny)iodonium camphorsulfonate | 3.10 weight % of resin binder (same molar amount as PAG of Example 1) |
| 3. Solvent: PMA | added to provide a solution at 19 weight % total solids |

The resist samples of this Example 1a were treated and processed in the same manner as described in Example 1 above. Significant photospeed differences were observed among these Example 1a resist samples over storage time.

Specifically, for resist samples stored at 20° C., the following Eo (mj/cm$^2$) values were recorded: sample tested immediately after preparation: $E_o$=4.6; sample tested at 7 days after preparation: $E_o$=4.0; sample tested at 14 days after preparation: $E_o$=3.5.

For resist samples stored at 40° C., the following Eo (mj/cm$^2$) values were recorded: sample tested immediately after preparation: $E_o$=4.6; sample tested at 7 days after preparation: $E_o$=2.2; sample tested at 14 days after preparation: $E_o$=1.7.

Example 2

A photoresist formulation was prepared by admixing the following components and above-mentioned additives of the specified amounts:

| Component | Amount: |
| --- | --- |
| 1. Resin Binder | 18.59 grams |
| 2. PAG: triphenylsulfonium pentafluorobenzenesulfonate | 2.21 weight % of resin binder |
| 3. Solvent: PMA | added to provide a solution at 19 weight % total solids |

Samples of the Example 2 resist formulation were treated and processed as described in Example 1 above. For the resist formulation samples (i.e., the samples stored for 0, 7 or 14 days after preparation at the above-specified temperatures), essentially no change in photospeed was observed between samples stored at 0, 7 or 14 days at the varying temperatures, thus indicating good storage stability of the resist formulation.

Example 2a

Comparative Using Iodonium Type PAG)

A comparative photoresist formulation was prepared by admixing the following components and above-mentioned additives of the specified amounts:

| Component | Amount: |
| --- | --- |
| 1. Resin Binder | 18.41 grams |
| 2. PAG: di-(4-t-butylphenyl)iodonium pentafluorobenzenesulfonate | 3.18 weight % of resin binder (same molar amount as PAG of Example 2) |
| 3. Solvent: PMA | added to provide a solution at 19 weight % total solids |

Example 2a resist samples were treated and processed in the same manner as described in Example 1 above. Significant photospeed differences were observed among these Example 2a resist samples over storage time.

Specifically, for resist samples stored at 20° C., the following Eo (mj/cm$^2$) values were recorded: sample tested immediately after preparation: $E_o$=3.5; sample tested at 7 days after preparation: $E_o$=3.1; sample tested at 14 days after preparation: $E_o$=2.9.

For resist samples stored at 40° C., the following Eo (mj/cm$^2$) values were recorded: sample tested immediately after preparation: $E_o$=3.5; sample tested at 7 days after preparation: $E_o$=2.0; sample tested at 14 days after preparation: $E_o$=1.5.

Example 3

A photoresist formulation was prepared by admixing the following components and above-mentioned additives of the specified amounts:

| Component | Amount |
| --- | --- |
| 1. Resin Binder | 16.22 grams |
| 2. PAG: triarylsulfonium camphorsulfonate | 3.58 weight % of resin binder |
| 3. Solvent: ethyl lactate | added to provide a solution at 16.8 weight % solids |

Samples of the resist formulation were stored at temperatures of −10° C. and 40° C. in a dark-colored glass bottle for 10 days after resist preparation.

Each of the resist formulations was spin coated onto a silicon wafer substrate to a layer thickness of 7250 angstroms and soft-baked on a vacuum hotplate at 135° C. for 60 seconds. The dried resist layer was then exposed (GCA XLS 7800 DUV stepper 0.53NA, 0.74 sigma) with CymerKrF Laser), post-exposure baked at 140° C. for 90 seconds and developed with 0.26N aqueous tetramethylammonium hydroxide solution for 45 seconds SSP (single spray puddle development).

Essentially no change in photospeed of the samples was observed during storage, thus indicating good storage stability of the resist formulation.

Example 3a

Comparative Using Iodonium-Type PAG

A photoresist formulation was prepared by admixing the following components and above-mentioned additives of the specified amounts:

| Component | Amount |
| --- | --- |
| 1. Resin Binder | 16.15 grams |
| 2. PAG: di-(4-t-butylphenyl)iodonium camphorsulfonate | 4.0 weight % (same molar amount as PAG of Example 3) |
| 3. Solvent: ethyl lactate | added to provide a solution at 19 weight % solids |

Samples of the Example 3a resist formulation were stored at temperatures of 4° C. and 50° C. in a dark-colored glass bottle for 7 days and 14 days after resist preparation. These Example 3a resist samples were processed as described in Example 3 above.

Significant photospeed differences were observed among the resist samples over storage time and temperature. Specifically, for resist samples tested at 4° C. for 14 days after preparation: $E_o$=3.43; for resist samples stored at 50° C. for 7 days after preparation: $E_o$=2.22; for resist samples tested at 50° C. for 14 days after preparation: $E_o$=1.81. These changes in photospeed with storage time and temperature indicate storage instability of the resist formulation.

Examples 4-5

PAG Syntheses

Example 4

Preparation of di-(4-tolyl)-4-octyloxyphenylsulfonium 10-camphorsulfonate

A 3-neck flask equipped with a thermometer, a nitrogen outlet and a mechanical stirrer, was charged with phosphorous pentoxide (8.64 g) followed by methanesulfonic acid (85.20 g). The resulting mixture was stirred at room temperature for 0.5 hour and then heated at 50° C. for 2-3 hours to obtain a homogeneous suspension. The mixture was cooled to below 10° C. in an ice-water bath and n-octylphenyl ether (21.66 g, 0.105 mol) was added. Next, p-tolylsulfoxide (20.03 g, 0.10 mol) was added with good stirring while maintaining the temperature of the reaction below 10° C. After stirring for 1 hour, the cooling bath was removed and the reaction was stirred at room temperature for 16 hours. Thereafter, the reaction mixture was added dropwise to a mixture of ice-water (500 mL) with vigorous stirring. The aqueous mixture was washed with toluene/hexane (3×100 mL, 1:1) and extracted with dichloromethane (3×200 mL). The combined organic layers were treated with an aqueous solution of ammonium 10-camphorsulfonate (prepared by neutralization of 10-camphorsulfonic acid (29.04 g, 0.125 mol) with ammonium hydroxide (14.53M, 8.6 mL, 0.125 mol)). The two phase solution was stirred at room temperature for 16 hours. The layers were separated and the aqueous phase extracted with dichloromethane (3×200 mL). The combined organic layers were washed with water (3×200 mL) and concentrated in vacuo to give a dark oil which solidified on standing to give a lightly colored solid @ 65 g. The solid was triturated in ether-ethylacetate for 18 hours, collected by suction filtration and dried in vacuo to provide the title compound, di-(4-tolyl)-4-octyloxyphenylsulfonium 10-camphorsulfonate, as a white solid.

Example 5

Preparation of 4-t-butyl-di-(4-tolyl)sulfonium pentafluorobenzenesulfonate

Part 1

Preparation of 4-t-butyl-di-(4-tolyl)sulfonium bromide

A 3-neck flask equipped with a thermometer, a nitrogen outlet and a mechanical stirrer, was charged with p-tolylsulfoxide (11.52 g, 50.0 mol). Dichloromethane (100 mL) was added and the resulting solution cooled to −78° C. Trimethylsilyl bromide (9.19 g, 60.0 mmol) was added and the resulting solution stirred at −78° C. for 15 min and then allowed to warm to 0° C. The mixture was stirred at 0° C. for 45 min, recooled to −78° C. and treated dropwise with a solution of 4-t-butylphenylmagnesium bromide (50 mL of a 2M solution in diethyl ether, 0.10 mol). After stirring at −78° C. for 1 hour, the mixture was warmed to 0° C. and stirred thereat for 1.5 hours. The reaction was quenched with 3% aqueous hydrobromic acid and extracted with dichloromethane. The combined dichloromethane extracts were dried in vacuo and the residual oil triturated in diethyl ether to provide a solid. That slid was isolated by suction filtration and dried in vacuo to provide 4-t-butyl-di-(4-tolyl)sulfonium bromide as a white powder.

Part 2

Methathesis of 4-t-butyl-di-(4-tolyl)sulfonium bromide to 4-t-butyl-di-(4-tolyl)sulfonium pentafluorobenzenesulfonate An aqueous solution of pentafluorobenzenesulfonic acid (2.40 g, 9.7 mmol) was neutralized by the addition of ammonium hydroxide (14.53M, 0.67 mL, 9.7 mmol). To this solution was added a solution of 4-t-butyl-di-(4-tolyl)sulfonium bromide (3.52 g, 8.5 mol, used directly from Part 1 above) in dichloromethane (75 mL). The resulting biphasic mixture was stirred at room temperature overnight. The layers were separated and the aqueous phase extracted with additional dichloromethane (2×50 mL). The combined organic layers were washed with water and concentrated in vacuo. The residue was triturated in tert-butyl methyl ether for 18 hours and the solid collected by suction filtration and dried in vacuo to provide 4-t-butyl-di-(4-tolyl)sulfonium pentafluorobenzenesulfonate as a white solid.

The foregoing description of the invention is merely illustrative thereof, and it is understood that variations and modifications thereof can be made without departing from the spirit or scope of the invention as set forth in the following claims.

What is claimed is:

1. A positive-acting photoresist composition comprising:
   1) a component that comprises photoacid-labile groups;
   2) a triphenyl sulfonium salt photoacid generator compound having a cation component that is substituted with one or more of a moiety that has at least 6 carbon atoms and is selected from optionally substituted alkyl, optionally substituted alkenyl, optionally substituted alkynyl, optionally substituted heteroalkyl, optionally substituted heteroalkenyl or optionally substituted heteroalkynyl,
   and the photoacid generator compound having an anion compound that is i) an arylsulfonate counter anion substituted with one or more electron-withdrawing groups or ii) an alicyclic moiety that is substituted with one or more electron-withdrawing groups; and
   3) propylene glycol methyl ether acetate, and wherein the composition contains less than about 10 weight percent, based on total weight of the composition, of a hydrolytic solvent.

2. The photoresist of claim 1 wherein the photoacid generator is a triphenyl sulfonium salt that has one or more phenyl groups substituted by the moieties.

3. The photoresist of claim 1 wherein the photoacid generator is substituted by one or more alkoxy groups.

4. The photoresist of claim 1 wherein the photoacid generator is substituted by one or more alkyl groups.

5. The photoresist of claim 1 wherein the photoresist composition contains less than about 2 weight percent of a hydroxylic solvent, based on total weight of the composition.

6. A method for forming a photoresist relief image onto a substrate comprising:
   a) applying a coating layer of a photoresist composition of claim 1 on a substrate; and b) exposing and developing the photoresist coating layer to provide a photoresist relief image of the photoresist composition.

7. An article of manufacture comprising a substrate having coated thereon the photoresist of claim 1.

8. The article of claim 7 wherein the substrate is a microelectronic wafer.

* * * * *